US009065461B1

(12) United States Patent
Wong et al.

(10) Patent No.: US 9,065,461 B1
(45) Date of Patent: Jun. 23, 2015

(54) CODING AND DECODING ISOLATION DEVICE AND METHOD THEREOF

(71) Applicant: Avago Technologies General IP (Singapore) Pte. Ltd., Singapore (SG)

(72) Inventors: Chee Heng Wong, Singapore (SG); Hui Fung Sim, Singapore (SG); Peng Siang Seet, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/598,020

(22) Filed: Jan. 15, 2015

(51) Int. Cl.
*H03M 7/00* (2006.01)
*H03M 1/12* (2006.01)

(52) U.S. Cl.
CPC . *H03M 7/00* (2013.01); *H03M 1/12* (2013.01)

(58) Field of Classification Search
CPC ........... H03M 7/00; H03M 1/12; H04L 25/06
USPC ..................................... 341/50, 55, 143, 155
See application file for complete search history.

(56) References Cited

U.S. PATENT DOCUMENTS

| 5,870,046 | A | * | 2/1999 | Scott et al. ..................... 341/143 |
| 6,359,983 | B1 | * | 3/2002 | Krone et al. ............. 379/399.01 |
| 6,385,235 | B1 | * | 5/2002 | Scott et al. ..................... 375/220 |
| 7,737,871 | B2 | * | 6/2010 | Leung et al. .................. 341/100 |
| 8,477,856 | B2 | | 7/2013 | Gaalaas |
| 2003/0025971 | A1 | | 2/2003 | Price et al. |

OTHER PUBLICATIONS

"New Product applications—Voltage to pulse rate converters assure synchronous pulse trains", IEEE Spectrum, Apr. 1974, 5 pages.
Chen et al., "High Speed Digital Isolators Using Microscale On-Chip Transformers", 2003, Analog Devices, Inc., 6 pages.

* cited by examiner

*Primary Examiner* — Khai M Nguyen

(57) ABSTRACT

An isolation device having first and second semiconductor is disclosed. The first semiconductor die may be adapted to transmit a first signal to the second semiconductor die that is electrically isolated. The first semiconductor die may comprise input terminals, a bitstream encoding circuit, a self-synchronizing encoding circuit and a transmitter. The second semiconductor die may comprise a receiver, a self-synchronizing decoder, a bitstream decoding circuit and an optional digital filter. The bitstream encoding and decoding may enable a plurality of signals to be encoded and transmitted through an isolation material.

28 Claims, 10 Drawing Sheets

GENERATING A HEADER AND ARRANGING THE HEADER, THE FIRST AND SECOND DIGITAL DATA STREAMS IN AT LEAST PARTIALLY INTERDIGITATED MANNER INTO THE COMBINED DATA STREAM
/ 422

FIG. 4B

GENERATING THE COMBINED DATA STREAM IN ACCORDANCE WITH A LOOKUP TABLE USING PARTIAL BITS OF THE FIRST AND SECOND DIGITAL DATA STREAMS
/ 424

FIG. 4C

CODING AND DECODING ISOLATION DEVICE AND METHOD THEREOF

FIELD OF THE DISCLOSURE

The present disclosure is generally directed toward electronic isolation and devices for accommodating the same.

BACKGROUND

An isolation device provides a means for moving a signal from one electrical circuit to another electrical circuit when the two electrical circuits must otherwise be electrically isolated from one another. Usually the two electrical circuits operate at different voltages, and thus, must be electrically isolated from one another. For example, consider an application in which a 5V battery-powered controller board is utilized to control a motor circuit operating at 240V. In this example, it is essential to electrically isolate the 240V motor circuits from the 5V controller circuit, while permitting the 5V controller circuit to send or receive signals from the 240V motor circuit. In this type of application, an isolation device may be used to provide voltage and noise isolation, while permitting the information exchange between the two circuit systems. For electrical systems with more than two circuits operating at different voltages, a multichannel isolation device may be used.

In an isolated system where two or more signals are transmitted across an isolation barrier, an equivalent number of isolation devices are typically required to transmit the signals across the isolation barrier. The requirement for equivalent number of isolation devices adds to cost. Furthermore, in some cases it may not be feasible to employ two isolation devices in an integrated circuit package due to space constraints.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings may be for illustrative purpose to assist understanding and may not be drawn per actual scale. For example, timing charts for some embodiments may be drawn out of proportion to enhance understanding.

FIG. 4B illustrates a first optional step for the method shown in FIG. 4A; and

FIG. 4C illustrates a second optional step for the method shown in FIG. 4A.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, portions, sections, substrates, etc.) illustrated and described herein but are to include deviations in shapes that result, for example, from manufacturing.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Figure 1A:
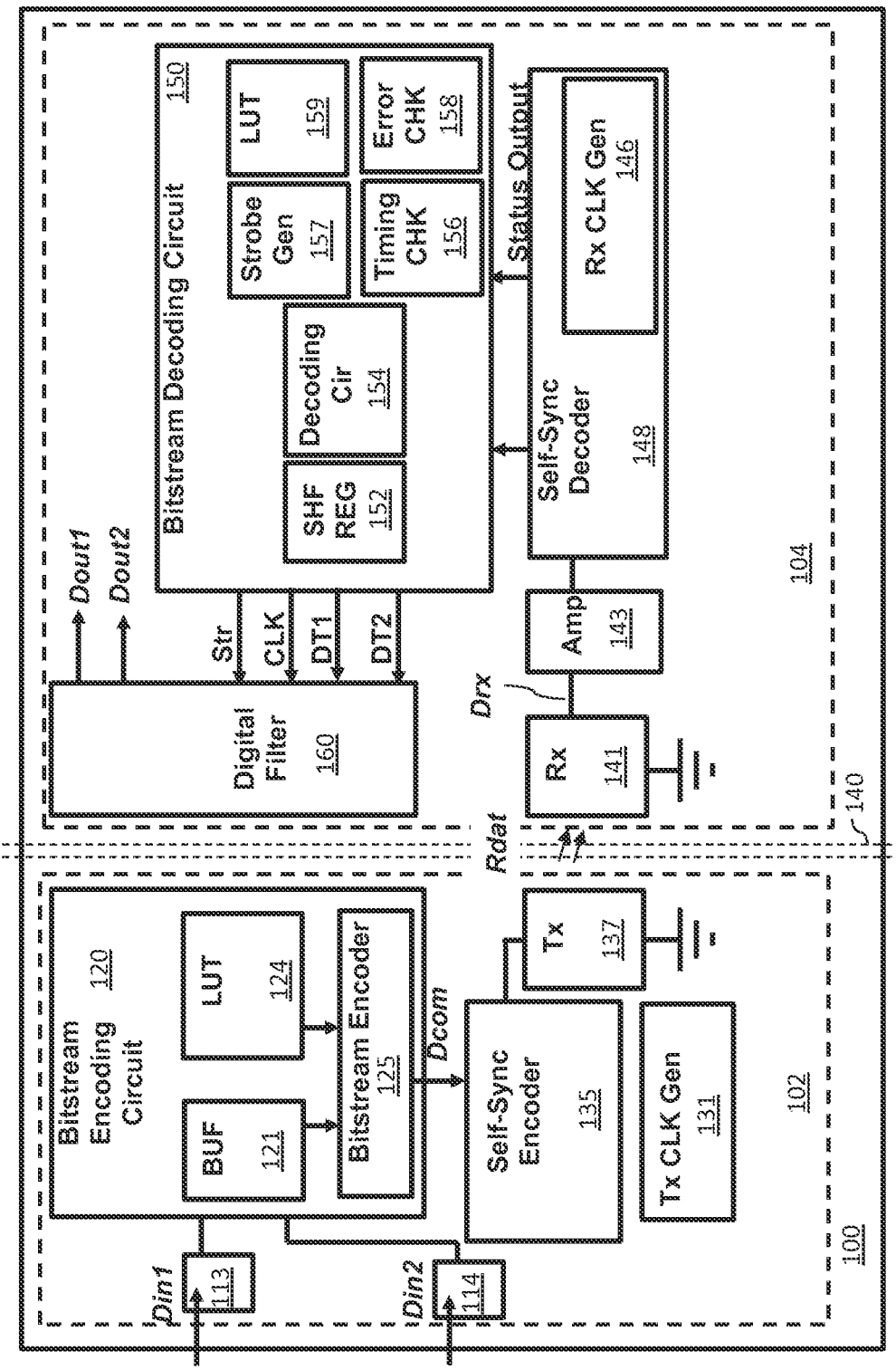
FIG. 1A shows an illustrative block diagram of an isolation device.

FIG. 1A shows an illustrative block diagram of an isolation device 100. The isolation device 100 may comprise a first semiconductor die 102 and a second semiconductor die 104. The second semiconductor die 104 may be located adjacent to but electrically isolated from the first semiconductor die 102. For example, the first semiconductor die 102 and the second semiconductor die 104 may be formed within a lead frame package or any other type of packaging used to house or contain the first and second semiconductor dies 102, 104. The first semiconductor die 102 and the second semiconductor die 104 may be spaced apart and separated by an isolation barrier 140 (also referred as an isolation material 140) that electrically isolates the first semiconductor die 102 from the second semiconductor die 104. The isolation material 140 may be an insulation material such as epoxy, silicone, ceramic or any other electrical insulation materials. In one embodiment, the isolation material 140 may comprise high voltage insulation material such as a polyimide material such as a polyimide tape.

The first semiconductor die 102 and the second semiconductor die 104 may be arranged facing one another in the lead frame package. Alternatively, the first semiconductor die 102 and the second semiconductor die 104 may be formed on a common substrate such as a printed circuit board. In another embodiment, the first semiconductor die 102 and the second semiconductor die 104 may be formed on one or two lead frames (not shown) that may be arranged in close proximity within a package but separated by a high voltage insulating material.

Figure 1B:
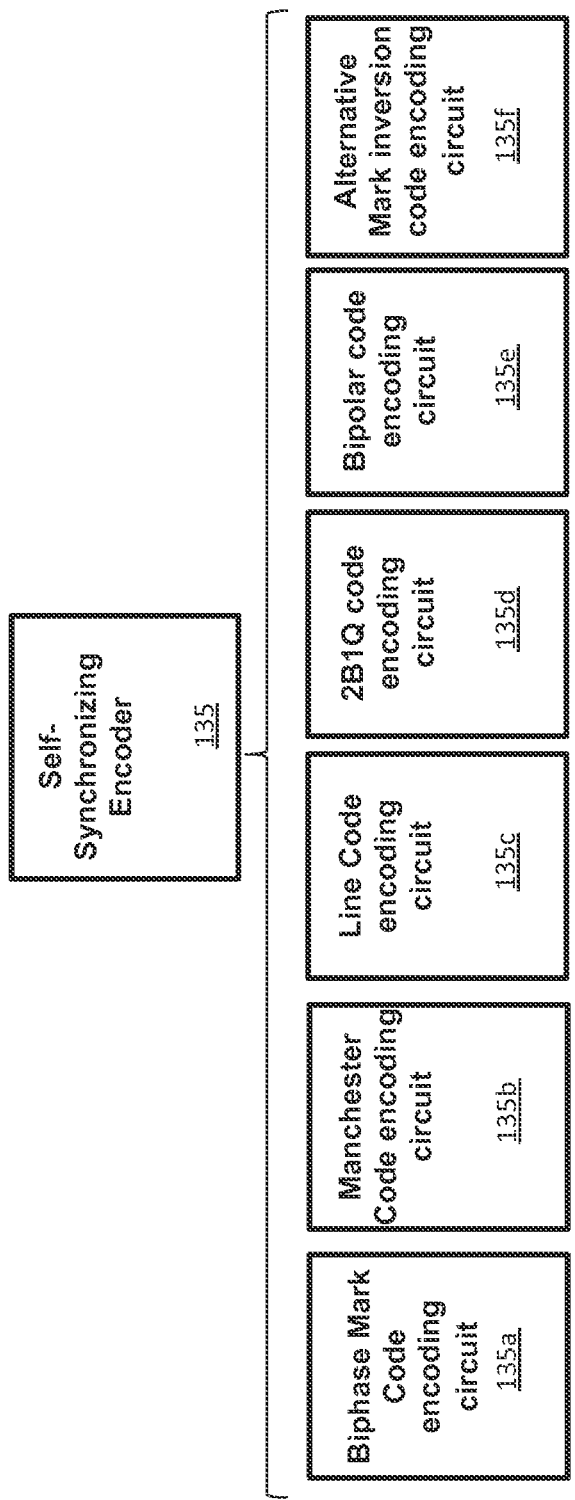
FIG. 1B shows a list of candidates of encoding scheme suitable for the self-synchronizing circuit shown in FIG. 1A.
Figure 1C:
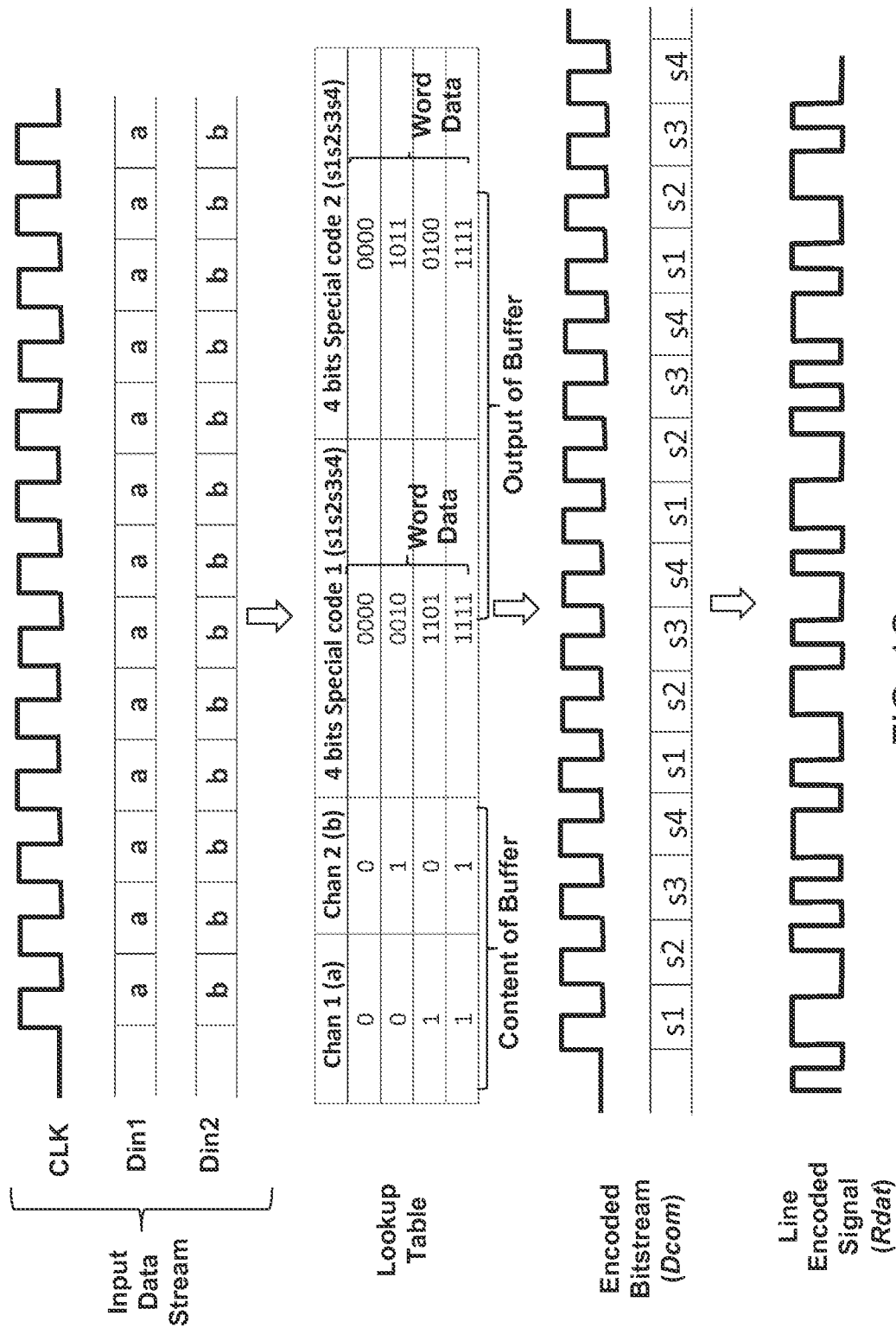
FIG. 1C shows an illustrative timing chart for a transmitter of the isolation device shown in FIG. 1A.
Figure 1D:
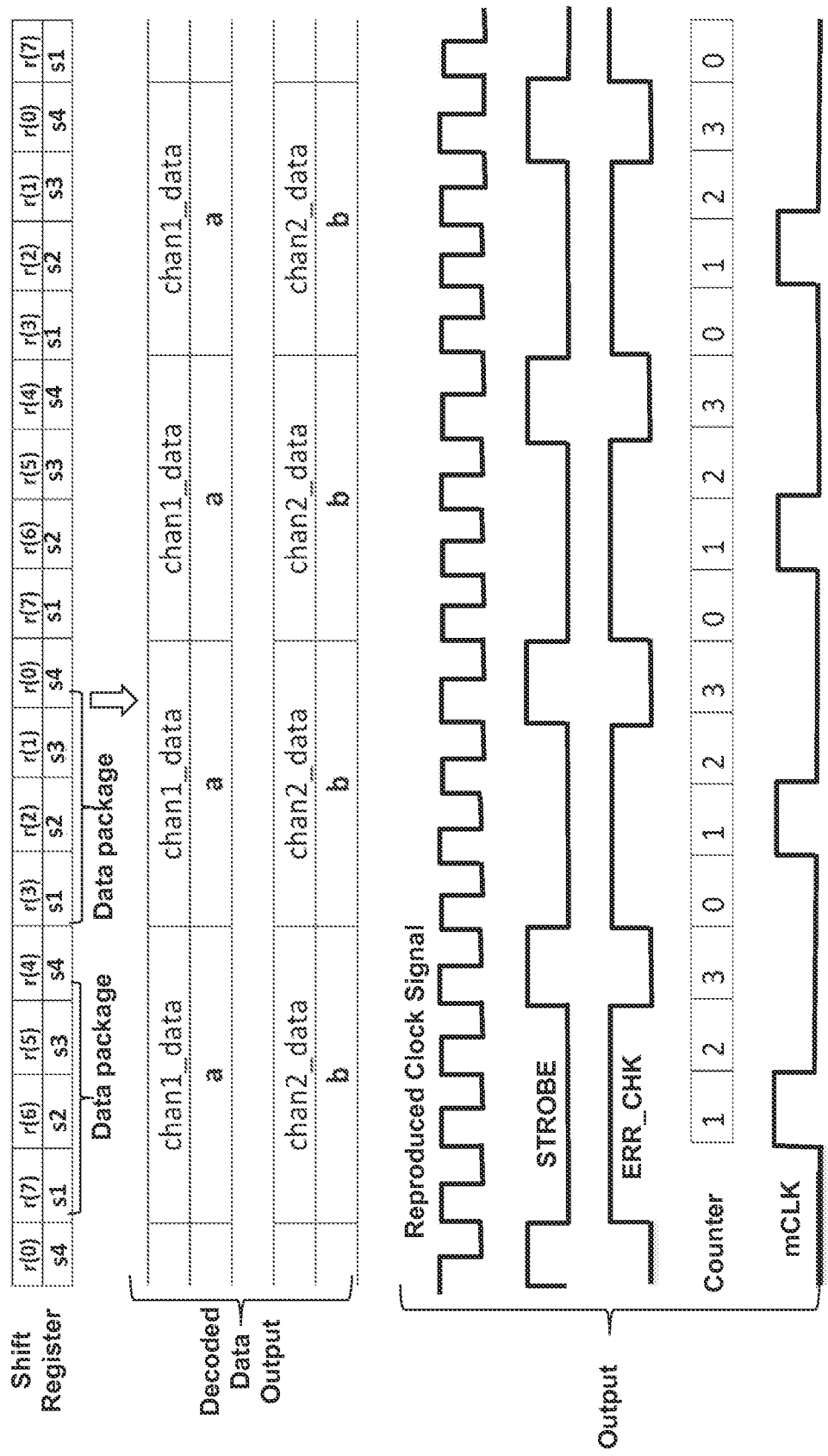
FIG. 1D shows an illustrative timing chart for a receiver of the isolation device shown in FIG. 1A.

The isolation device 100 may comprise a first input terminal 113, a second input terminal 114, a bitstream encoding circuit 120, an optional self-synchronizing code encoder 135, a transmitter 137, and an optional transmitting clock generator 131 provided within the first semiconductor die 102. FIG. 1B shows a list of candidates of encoding scheme suitable for the optional self-synchronizing code encoder 135 shown in FIG. 1A. FIG. 1C shows an illustrative timing chart for transmitting portions of the isolation device 100 shown in FIG. 1A. The isolation device 100 may further comprise a receiver 141, an optional amplifier circuit 143, an optional self-synchronizing code decoder 148, a bitstream decoding circuit 150 and an optional digital filter 160 provided within the second semiconductor die 104. FIG. 1D shows an illustrative timing chart for receiving portions of the isolation device 100 shown in FIG. 1A.

The first input terminal 113 and the second input terminal 114 may be configured to receive a first digital data stream Din1 and a second digital data stream Din2 respectively. Alternatively, the first input terminal 113 and the second input terminal 114 may be configured to receive analog signals. In such circumstances, a first sigma-delta analog-to-digital converter and a second sigma-delta analog-to-digital converter may be coupled to the first and second input terminals 113, 114, respectively, so as to generate the first digital data stream Din1 and the second digital data stream Din2, respectively.

Generally, the bitstream encoding circuit 120 may be configured to arrange the first and second digital data streams Din1, Din2 into a combined data stream Dcom. The combined data stream Dcom may be fed, either directly or indirectly, to the transmitter 137 that may be configured to transform the combined data stream Dcom into a radiation data stream Rdat. The radiation data stream Rdat may be transmittable through the isolation barrier 140. In the embodiment shown in FIG. 1A, the transmitter 137 may be a capacitive element configured to generate an electric field signal that may comprise the radiation data stream Rdat. In another embodiment, the transmitter 137 may be an emitter such as a light-emitting die, or a magnetic element provided outside the first semiconductor die 102 to generate light signal or a magnetic signal. The transmitter 137 may be configured to generate a radio-frequency signal in yet another embodiment.

The receiver 141 may be provided in the second semiconductor die 104. The receiver 141 may be separated from the transmitter 137 by the isolation barrier 140. The receiver 141 may be configured to receive the radiation data stream Rdat. In response to receiving the radiation data stream Rdat, the receiver 141 may generate a received data stream Drx. The received data stream Drx may be coupled to the bitstream decoding circuit 150. Optionally, the received data stream Drx may be amplified by employing the optional amplifier circuit 143 and may be fed through the self-synchronizing code decoder 148. The bitstream decoding circuit 150 may be configured to decode the received data stream Drx so as to generate a first received digital data stream Dout1 and a second received digital data stream Dout2 as a reproduction of the first and second digital data streams Din1, Din2.

The bitstream encoding circuit 120 may operate at a clock rate at least four times faster than the first and second digital data streams Din1, Din2. Optionally, the bitstream encoding circuit 120 may further comprise a buffer 121, an encoding lookup table (LUT) 124 and a bitstream encoder 125. The encoding lookup table 124 may comprise logic circuit. The buffer 121 may be configured to store at least partial bits of the first and second digital data streams Din1, Din2 in a predetermined manner. The encoding lookup table 124 may be configured to generate an output in accordance with the at least partial bits of the first and second digital data streams Din1, Din2. The output may be subsequently generated into the combined data stream Dcom by the bitstream encoder 125. The bitstream encoder 125 may be configured to arrange the output of the encoding lookup table 124 to a serial data stream.

Referring to an illustrative timing chart shown in FIG. 1C, the buffer 121 may comprise at least a two-bit register configured to store one bit of the first digital data stream Din1 and one bit of the second digital data stream Din2 of concurrent timing. The encoding lookup table 124 may comprises a plurality of word-data, wherein the plurality of word-data has a bit count at least twice as large as the buffer 121. In response to the contents of the buffer 121, the encoding lookup table 124 may be configured to generate a word-data as an output of the encoding lookup table 124. For example, when the content of the buffer 121 is "01", the encoding lookup table 124 may be configured to generate an output of "0010" as shown in FIG. 1C.

Each of the plurality of word-data is unique and not reproducible by combining any two other of the plurality of word-data when the word-data are adjoined and arranged in series. For example, the word-data "0010" may not be obtained by combining "0000", "1101", "1111" in any sequence in a serial data stream. For example, by combining and arranging "0000" and "1101" in series, the combined word-data may yield "0001", 0011", "0110", "1010", "0100", "1000". By combining and arranging "0000" and "1111" in series, the combined word-data may yield "0001", "0011", "0111", "1110", "1100", "1000". By combining and arranging "1101" and "1111" in series, the combined word-data may yield "1011", "0111", "1111". Note that none of the combination yield "0010". This feature of the encoding lookup table 124 may be advantageous to enable identification of codes because the word data in practice will be arranged in a combined serial signal without a header. There may be other sets of word-data suitable for lookup table 124, for example, another possible word-data contents may be "0000", "1011", "0100", "1111".

Referring to FIG. 1C, if the first 2 bits of the first digital data stream Din1 is "00" and the first 2 bits of the second digital data stream Din2 is "01", the output of the bitstream encoder 125 may be "00000010". Firstly, the buffer 121 may be configured to store the first bit of the first digital data stream Din1 and the first bit of the second digital data stream Din2. Consequently, the content of the buffer 121 may be "00". The encoding lookup table 124 in response may be configured to generate a word data of "0000". Subsequently, the buffer 121 may be configured to store the second bit of the first digital data stream Din1 and the second bit of the second digital data stream Din2. With this, the content of the buffer 121 may be "01". In response, the look up table 124 may be configured to generate "0010" as the output word data. The bitstream encoder 125 may subsequently arranged the corresponding word-data to yield the combined data stream Dcom "00000010" as output to the bitstream encoding circuit 120.

The optional transmitting clock generator 131 may be coupled to the optional self-synchronizing code encoder 135. The optional transmitting clock generator 131 may be configured to generate a transmitting clock signal. The optional self-synchronizing code encoder 135 may be configured to combine the combined data stream Dcom with the transmitting clock signal to form a single two-level self-synchronizing data stream. The optional self-synchronizing code encoder 135 may operate at a clock rate approximately 5-10 times the clock rate of the first digital data stream Din1 and the second bit of the second digital data stream Din2.

As shown in FIG. 1B, the optional self-synchronizing code encoder 135 may comprise one of a Biphase Mark Code encoding circuit 135a, a Manchester Code encoding circuit 135b, a Line Code encoding circuit 135c, a 2B1Q code encoding circuit 135d, a Bipolar Code encoding circuit 135e and an Alternative Mark inversion Code encoding circuit 135f. The optional self-synchronizing code encoder 135 may be configured to generate a code in which the encoding of each data bit has at least one transition and occupies the same time. The encoded code therefore may not have DC component, and may be self-clocking. The code may be inductively or capacitively coupled, and that a clock signal can be recovered from the encoded data.

Referring to FIG. 1A and FIG. 1C, the code generated by the optional self-synchronizing code encoder 135 may be coupled to the transmitter 137. The transmitter 137 may be configured to transform the output of the optional self-synchronizing code encoder 135 into the radiation data stream Rdat. The radiation data stream Rdat may be transmittable through the isolation barrier 140.

The optional self-synchronizing code decoder 148 may be configured to decode the received data stream Drx. Optionally, the optional self-synchronizing code decoder 148 may comprise a receiver clock generator 146 configured to generate a receiving clock signal from the received data stream Drx. The receiver clock generator 146 may be configured to generate a clock signal that may have a frequency that is substantially similar to the frequency of the clock signal generated by the optional transmitting clock generator 131. The optional self-synchronizing code decoder 148 may be configured to reproduce the combined data stream Dcom generated by the bitstream encoding circuit 120. In addition, the optional self-synchronizing code decoder 148 may be configured to generate a status output indicating successful receive of signals. The status output may be configured to detect a beginning point of the received data stream Drx during start-up or hard reset. In the example illustrated above where the first 2 bits of the first digital data stream Din1 is "00" and the first 2 bits of the second digital data stream Din2 is "01, the reproduced combined data stream coupled to the bitstream decoding circuit 150 may be "00000010".

The bitstream decoding circuit 150 may comprise a shift register 152, a decoding circuit 154, a strobe generator 157, a decoding lookup table 159, a timing-check circuit 156, and an error check circuit 158. The shift register 152 may be configured to receive the received data stream Drx generated by the optional self-synchronizing code decoder 148. The shift register 152 may have a bit size four times the bit size of the buffer 121. Referring to FIG. 1D, in the example where the first 2 bits of the first digital data stream Din1 is "00" and the first 2 bits of the second digital data stream Din2 is "01, the shift register 152 may be configured to store the reproduced combined data stream of "00000010".

The decoding circuit 154 may be a digital logic. The decoding circuit 154 may be coupled to the shift register 152. The decoding circuit 154 may be configured to generate the first received digital data stream Dout1 and the second received digital data stream Dout2 in accordance with the decoding lookup table 159. For example, when the shift register 152 detected the data stream of "00000010", the decoding circuit 154 may be configured to detect the predetermined word data of "0000" and "0010", and may be coupled to the decoding lookup table 159 to generate "00" and "01" as the first and second received raw digital data streams DT1, DT2. The first and second received raw digital data streams DT1, DT2 may be subsequently output as the first received digital data stream Dout1 and the second received digital data stream Dout2 as output of the second semiconductor die 104.

The timing-check circuit 156 may be configured to track a beginning of each of the plurality of word-data. The timing-check circuit 156 may comprise a counter for counting the required timing to decode the buffer 152. The counter may be coupled to the status output of the self-synchronizing decoder 148 so as to compute a beginning point of the received data stream Drx. For example, the timing-check circuit 156 may be configured to trigger the decoding circuit 154 to decode the buffer 152 at a predetermined time interval. The predetermined time interval may be four times the clock period of the received data stream Drx. The timing check circuit 154 may further comprise a start detection circuit to detect a beginning of the received data stream Drx.

The strobe generator 157 may be configured to generate a signal indicative of a starting point of each of the plurality of word-data. Referring to FIG. 1D, when a word-data is detected, the strobe generator 157 may be configured to generate a signal, STROBE that is indicative of a starting point of a word-data. For example, when one of the word-data, "0000", "0010", "1111", "1110" is detected, the signal, STROBE may be HIGH indicative of a beginning of the plurality of word-data. The error check circuit 158 may comprise a counter to generate an error check signal that is indicative of the distance between two word-data. As shown in FIG. 1D, the error check signal and the signal, STROBE may be complimenting each other during normal operation. When that is not the case, an error may be detected. The error check circuit 158 may be configured to trigger a series of self discovery activities such as resetting one or more of the registers of the bitstream decoding circuit 150.

The optional digital filter 160 may be coupled to the bitstream decoding circuit 150. The optional digital filter 160 may be configured to filter out noise, and may be configured to generate the first received digital data stream Dout1 and the second received digital data stream Dout2. The optional digital filter 160 may be a SINC2 and SINC3 filter that converts the serial data stream to a parallel data value, for example, a 10 bits or a 16 bits data output.

Figure 2A:
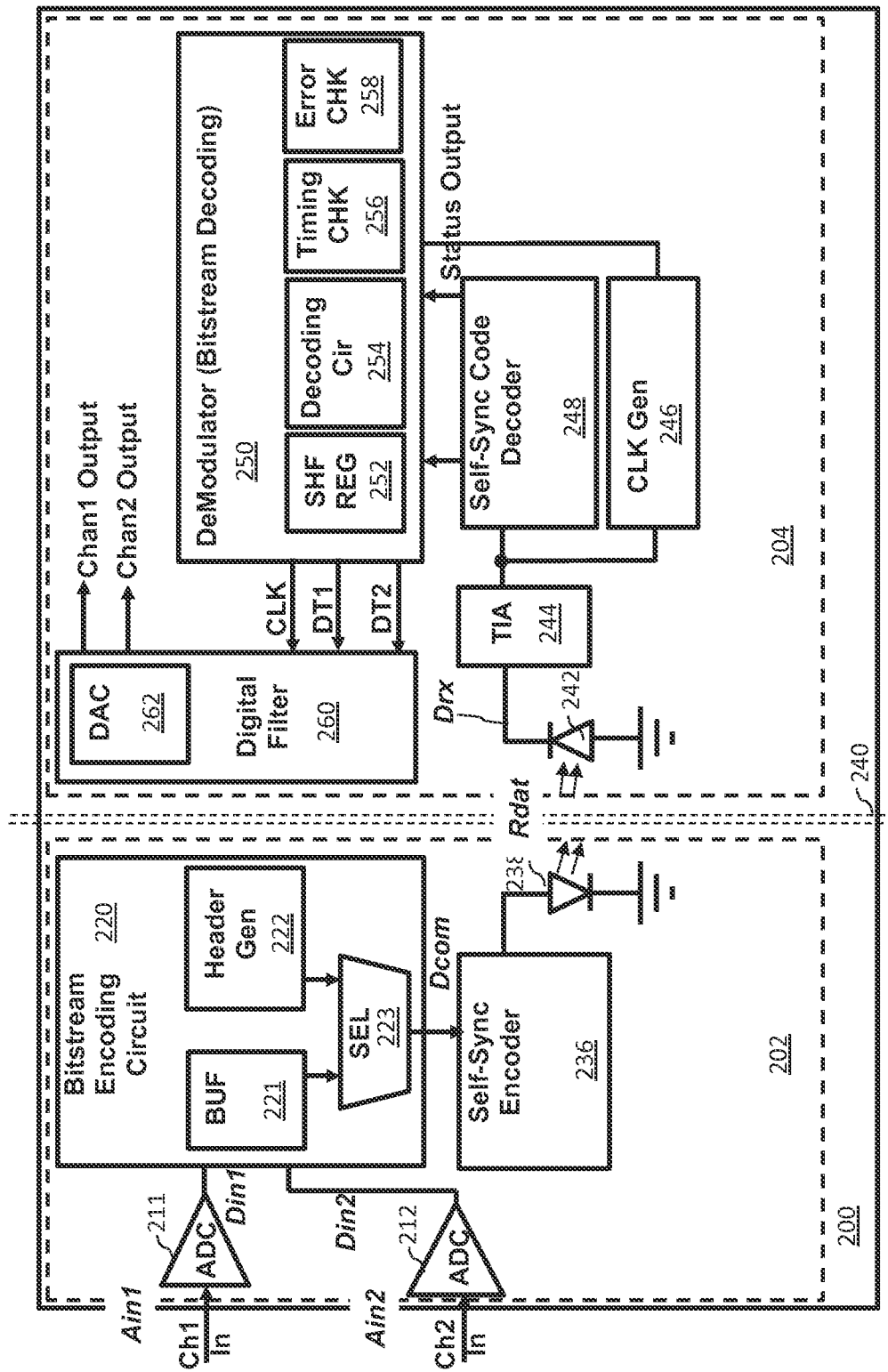
FIG. 2A shows an illustrative block diagram of an isolator.

FIG. 2A shows an illustrative block diagram of an isolator 200. The isolator 200 may be referred to as an isolation device. The isolator 200 may comprise a first semiconductor die 202 and a second semiconductor die 204. The second semiconductor die 204 may be located adjacent to but electrically isolated from the first semiconductor die 202. For example, the first semiconductor die 202 and the second semiconductor die 204 may be formed within a lead frame package or any other type of packaging used to house or contain the first and second semiconductor dies 202, 204. The first semiconductor die 202 and the second semiconductor die 204 may be spaced apart and separated by an isolation barrier 240 (also referred as an isolation material 240) that electrically isolates the first semiconductor die 202 from the second semiconductor die 204. The isolation material 240 may be an insulation material such as epoxy, silicone, ceramic or any other electrical insulation materials. In one embodiment, the isolation material 240 may comprise high voltage insulation material such as a polyimide material such as a polyimide tape.

The first semiconductor die 202 and the second semiconductor die 204 may be arranged facing each other in the lead frame package. Alternatively, the first semiconductor die 202 and the second semiconductor die 204 may be formed on a common substrate such as a printed circuit board. In another embodiment, the first semiconductor die 202 and the second semiconductor die 204 may be formed on one or two lead frames (not shown) that may be arranged in close proximity within a package but separated by a high voltage insulating material.

Figure 2B:
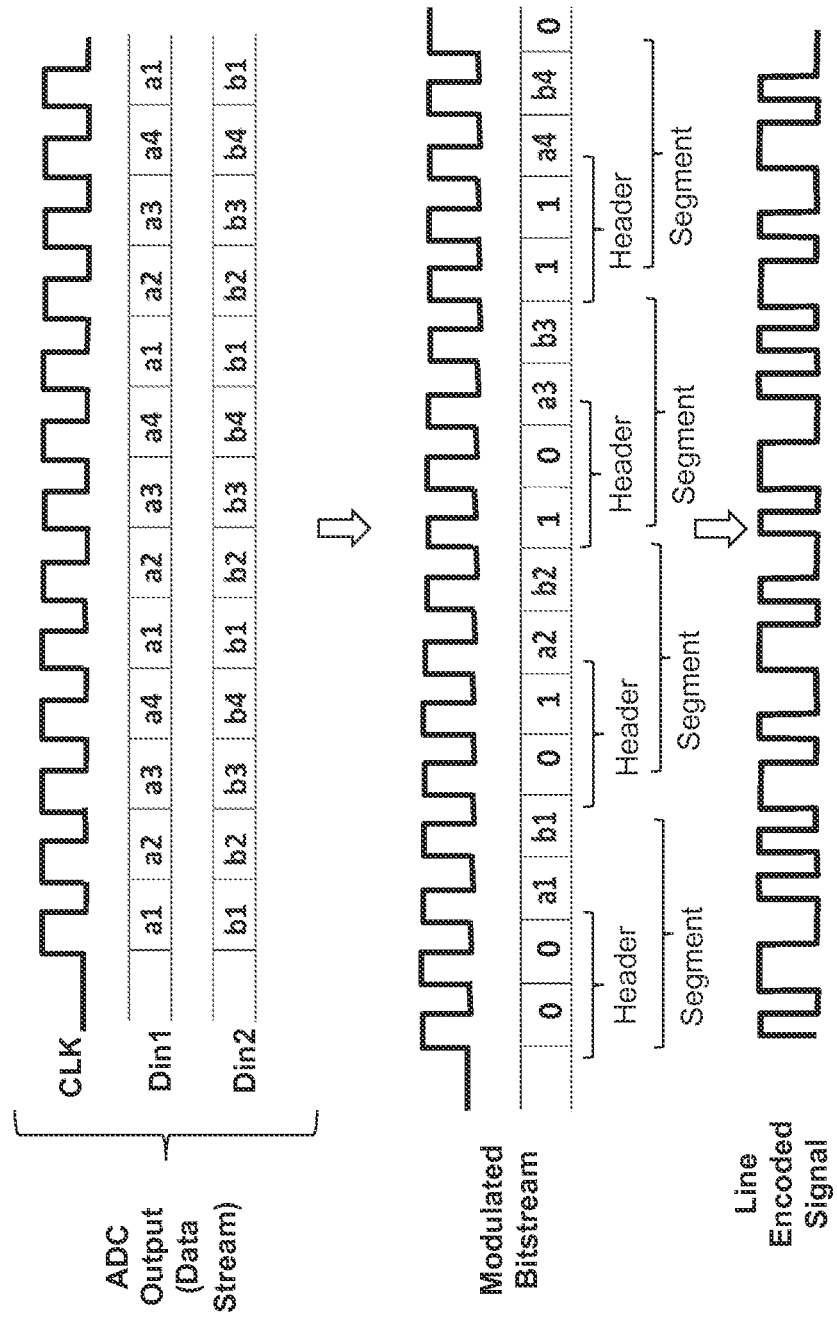
FIG. 2B shows an illustrative timing chart for a transmitter of the isolator shown in FIG. 2A.
Figure 2C:
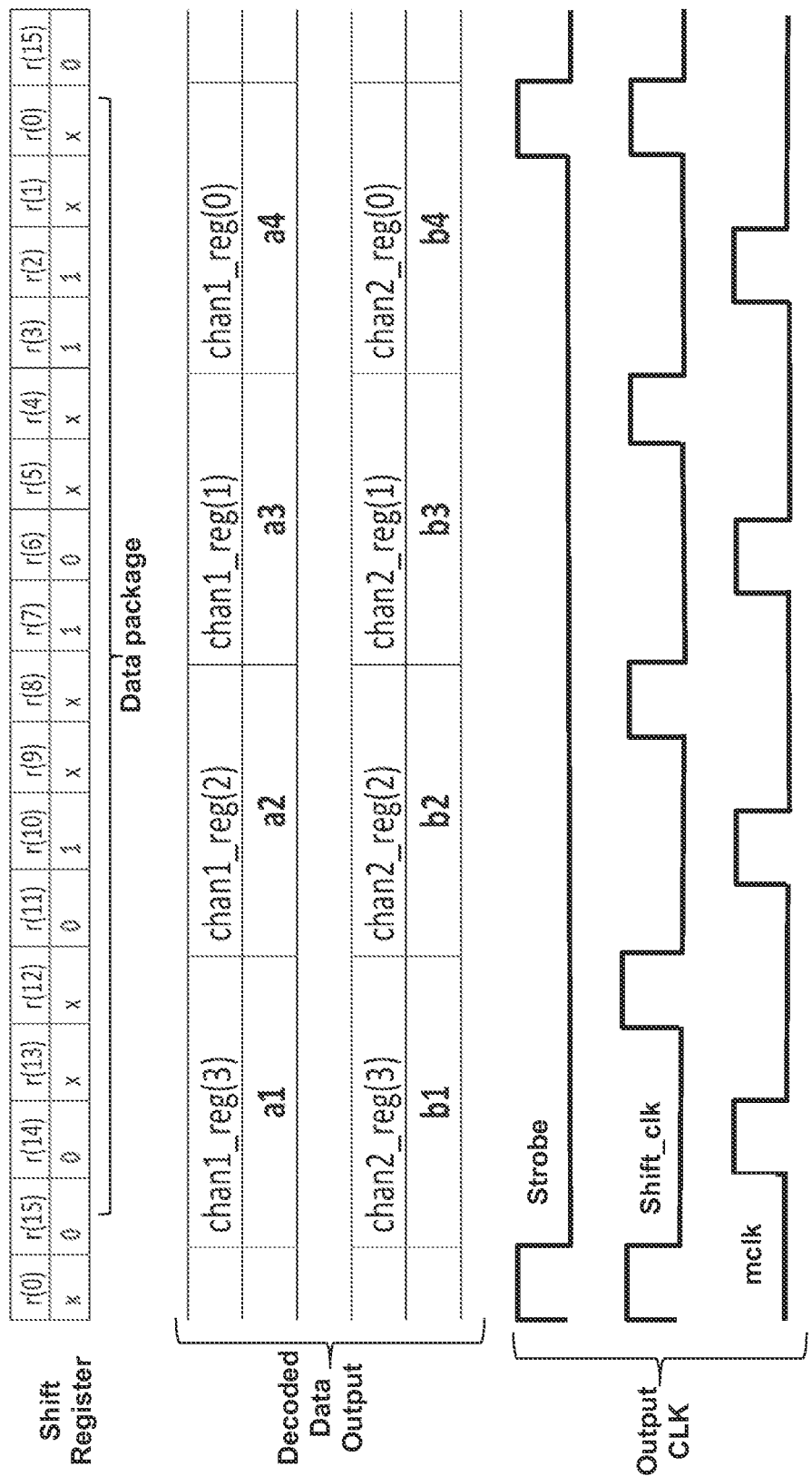
FIG. 2C shows an illustrative timing chart for a receiver of the isolator shown in FIG. 2A.

The isolator 200 may comprise a first analog-to-digital converter 211, a second analog-to-digital converter 212, a bitstream encoding circuit 220, an optional self-synchronizing code encoder 235, and a transmitter 238 provided within the first semiconductor die 202. FIG. 2B shows an illustrative timing chart for transmitting portions of the isolator 200 shown in FIG. 2A. The isolator 200 may further comprise a detector 242, an optional amplifier circuit 244, an optional self-synchronizing code decoder 248, an optional clock generator 246, a bitstream decoding circuit 250 and an optional digital filter 260 provided within the second semiconductor die 204. FIG. 2C shows an illustrative timing chart for receiving portions of the isolator 200 shown in FIG. 2A.

The first analog-to-digital converter 211 may be configured to receive a first analog input signal Ain1 and may be configured to generate a first digital data stream Din1 corresponding to the first analog input signal Ain1. The second analog-to-digital converter 212 may be configured to receive a second analog input signal Ain2 and may be configured to generate a second digital data stream Din2 corresponding to the second analog input signal Ain2. The first and second analog-to-digital converters 211, 212 may be sigma delta type analog-to-digital converters. The first and second digital data streams Din1, Din2 may be coupled to the bitstream encoding circuit 220. In other words, the bitstream encoding circuit 220 may be coupled to the first and second analog-to-digital converters 211, 212 so as to receive the first and second digital data streams Din1, Din2.

The bitstream encoding circuit 220 may be configured to generate a combined data stream Dcom having the first and second digital data streams Din1, Din2 arranged in at least a partially interdigitated manner. More specifically, the bitstream encoding circuit 220 may comprise a buffer 221, a header generator 222, and a selector 223. The buffer 221 may be configured to temporarily store the first and second digital data streams Din1, Din2 prior to being arranged into the combined data stream Dcom. The header generator 222 may be configured to generate a header. The selector 223 may be configured to arrange the header, the first and second digital data streams Din1, Din2 in the at least partially interdigitated manner as the combined data stream Dcom by arranging the header, the first and second digital data streams Din1, Din2 into a plurality of segments. This is illustrated in FIG. 2B. As shown in FIG. 2B, the combined data stream Dcom may comprise a plurality of segments, each segment having a header, one bit of the first digital data stream Din1 followed by one bit of a second digital data stream Din2. The header has a bit length. The bit length of the header may be approximately equal to the sum of number of digital data streams in each plurality of segments. For example, in the embodiment shown in FIG. 2B, each data segment of the plurality of segments may comprise two bits of information from the first and second digital data streams Din1, Din2. Therefore, the header has a bit length of 2 bits.

The optional self-synchronizing code encoder 235 may be configured to combine the combined data stream Dcom with a clock signal to form a single two-level self-synchronizing data stream. The transmitter 238 may be configured to transform the combined data stream Dcom that may present in the form of the single two-level self synchronizing data stream into a radiation data stream Rdat so as to transmit through the isolation barrier 240. The single two-level self-synchronizing data stream may be generated according to Manchester code or other similar coding method as explained in FIG. 1B. As explained in earlier embodiment, the transmitter 238 may be a light source, a magnetic field source, an electric field source or other similar radiation source that may be adaptable to transmit a radiation across the isolation barrier 240 without generating direct electrical current through the isolation barrier 240. In the embodiment shown in FIG. 2A, the transmitter 238 may be a light-emitting diode. The transmitter 238 may be provided in a separate chip outside the first semiconductor die 202.

As the detector 242 may reside in the second semiconductor die 204, the detector 242 may be provided adjacent to but distanced from the transmitter 238. The detector 242 may be configured to receive the radiation data stream Rdat and generate therein a received data stream Drx. In the embodiment shown in FIG. 2A, the detector 242 may be a photo-diode whereas the optional amplifier circuit 244 may be a trans-impedance amplifier circuit 244. The optional amplifier circuit 244 may be coupled to the trans-impedance amplifier circuit 244. The output of the detector 242 shown in FIG. 2A may carry the received data stream Drx in the form of output photo-current, whereas the output of the trans-impedance amplifier circuit 244 may carry the received data stream Drx in the form of output voltage.

The received data stream Drx may be coupled to the optional clock generator 246 and the bitstream decoding circuit 250. The optional clock generator 246 may be configured to generate a clock signal from the received data stream Drx. Alternatively, an external clock or a clock signal generated from an internal phase lock loop circuit may be employed. The optional self-synchronizing code decoder 248 may be configured to reproduce the combined data stream Dcom generated by the bitstream encoding circuit 220. In addition, the optional self-synchronizing code decoder 248 may be configured to generate a status output indicating successful receive of signals. The status output may be configured to detect a beginning point of the received data stream Drx during start-up or hard reset. The outputs of the optional self-synchronizing code decoder 248, both the received data stream Drx as well as the status output, may be coupled to the bitstream decoding circuit 250.

The bitstream decoding circuit 250 may be configured to reproduce the first and second digital data streams Din1, Din2. More specifically, the bitstream decoding circuit 250 may comprise a shift register 252, a decoding circuit 254, a timing-check circuit 256 and an error check circuit 258. The shift register 252 may be configured to store the reproduced combined data stream Dcom. The decoding circuit 254 of the bitstream decoding circuit 250 may be configured to decode the header so as to identify the plurality of segments in a correct sequence. When a specific header code is detected, the decoding circuit 254 may be configured to extract the first and second digital data streams Din1, Din2 into two separate registers.

In addition, the decoding circuit 254 may be configured to generate a strobe signal, a clock signal and a shifted clock signal. The strobe signal may indicate a starting point of the reproduced first and second digital signals Din1, Din2. The clock signal and the shifted clock signal may indicate a starting point of each bit of the reproduced first and second digital signals Din1, Din2. This is illustrated in FIG. 2C.

The timing-check circuit 256 may be configured to track a beginning of each of the first and second digital data stream Din1, Din2. The timing-check circuit 256 may comprise a counter for counting the required timing to decode the buffer 252. For example, the timing-check circuit 256 may be configured to trigger the decoding circuit 254 to decode the buffer 252 at a predetermined time interval. The predetermined time interval may be four times the clock period of the received data stream Drx. The timing check circuit 254 may further comprise a start detection circuit to coupled to the status output of the optional self-synchronizing circuit 148 to detect a beginning of the received data stream Drx.

The error check circuit 258 may be configured to check sequence of the plurality of segments. More specifically, the error check circuit 258 may be configured to check the headers in the received signals and the intervals of the header detected. The error check circuit 258 may be configured to output an error signal when an error condition is detected. An error condition may be triggered by incorrect header contents, incorrect header intervals, and other faulty functionality of the isolator 200. In addition, the error check circuit 258 may be configured to trigger a series of self discovery activities such as resetting some of the registers of the bitstream decoding circuit 250.

The optional digital filter 260 may be coupled to the bitstream decoding circuit 250. The optional digital filter 260 may be configured to filter out noise, and may be configured to generate the first received digital data stream Dout1 and the second received digital data stream Dout2 as outputs to the second semiconductor die 204. Optionally, the optional digital filter 260 may comprise a digital-to-analog converter 262 configured to convert the first received digital data stream Dout1 and the second received digital data stream Dout2 into a reproduced analog signals Ain1, Ain2.

Figure 3A:
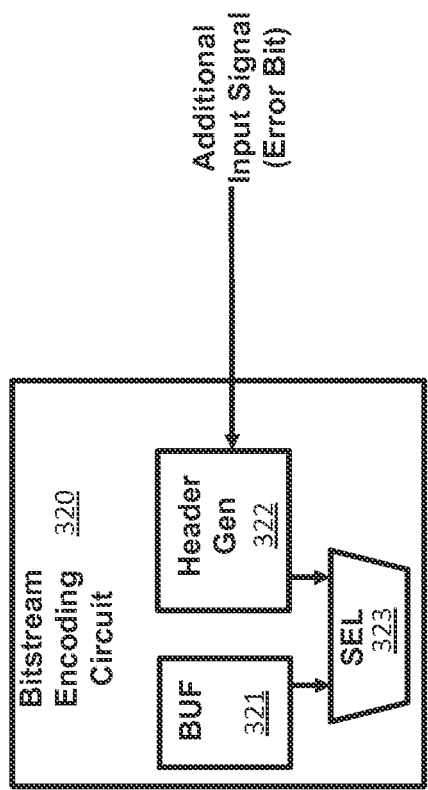
FIG. 3A shows an illustrative block diagram of an alternative bitstream encoding circuit.
Figure 3B:
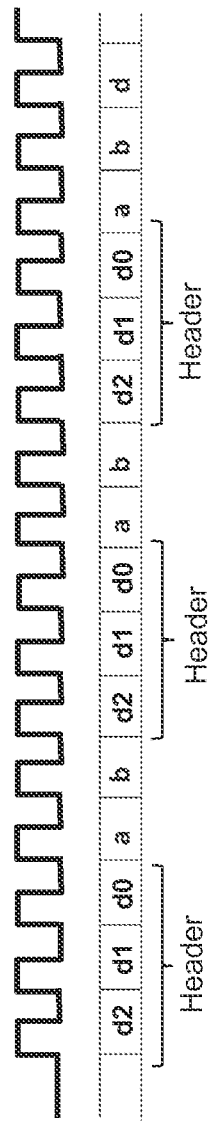
FIG. 3B shows an illustrative timing chart for the alternative bitstream encoding circuit shown in FIG. 3A.

FIG. 3A shows an illustrative block diagram of an alternative bitstream encoding circuit 320. The alternative bitstream encoding circuit 320 may be used in place of the bitstream encoding circuit 320 shown in FIG. 2A. The alternative bitstream encoding circuit 320 may comprise a buffer 321, a header generator 322 and a selector 323. The alternative bitstream encoding circuit 320 may be substantially similar to the bitstream encoding circuit 220 shown in FIG. 2A but may at least differ in that the alternative bitstream encoding circuit 320 is coupled to an additional digital input signal and that the header may be generated in accordance with the additional digital input signal. FIG. 3B shows an illustrative timing chart for the alternative bitstream encoding circuit shown in FIG. 3A. Compared to the bitstream encoding circuit 220 shown in FIG. 2A, the bitstream encoding circuit 320 shown in FIG. 3A may have one additional bit. The additional bit may be indicative of the additional digital input signal. In the embodiment shown in FIG. 3B, the additional digital input signal may be an error bit signal representative an error condition of an external circuit.

Figure 4A:
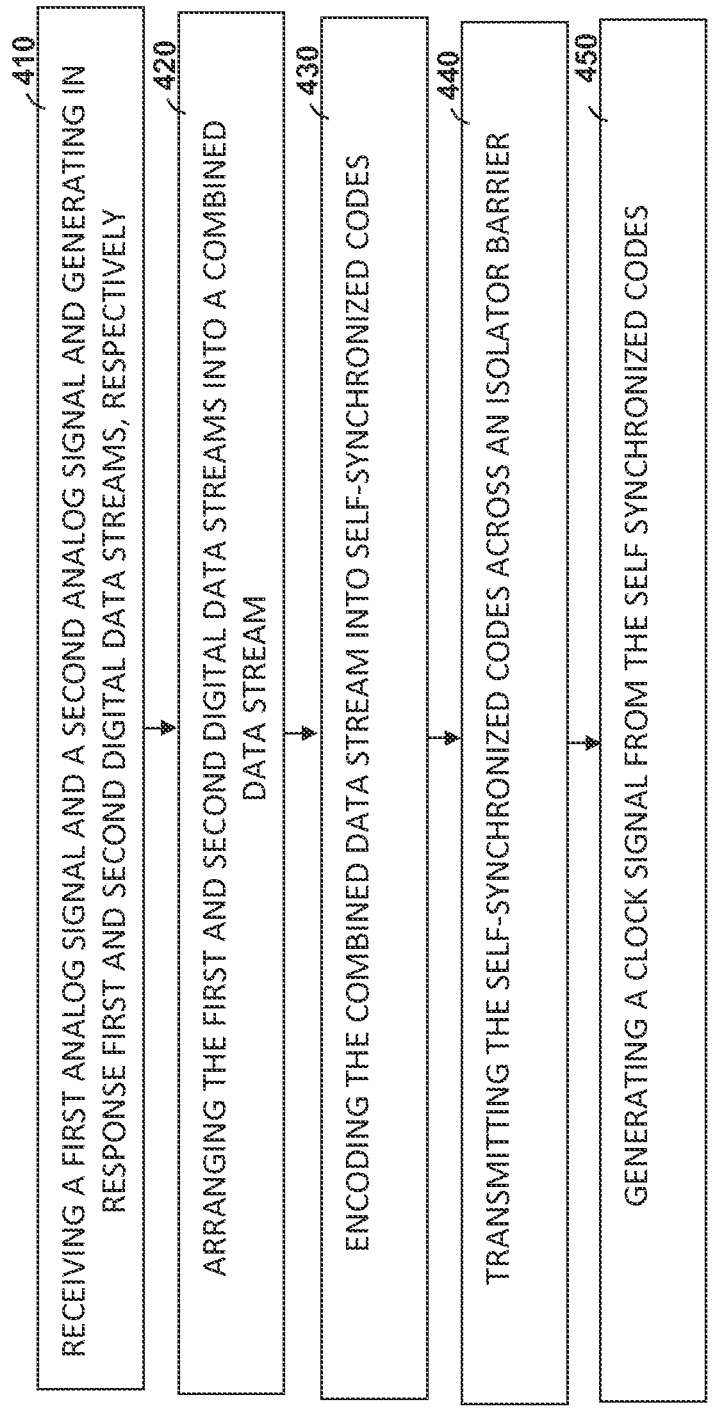
FIG. 4A illustrates a flow chart showing a method for conveying a first analog signal and a second signal across an isolator barrier.

FIG. 4A illustrates a flow chart showing a method 400 for conveying a first signal and a second signal across an isolator barrier. In step 410, the first signal and the second signal may be received. In response, first and second digital data streams may be generated, respectively. For example, the first and second signals may be analog signals that may be received at input terminals. In response, the first and second signals may be converted into the first and second digital data streams. Alternatively, the first and second signal may be digital signals received at input terminals. The first and second signal may be generated into the first and second digital data streams in accordance to an internal clock.

Next, the method may proceed to step 420 in which the first and second digital data streams may be arranged into a combined data stream. In step 430, the combined data stream may be encoded into self-synchronized codes. This is followed by step 440 where the self-synchronized codes may be transmitted across the isolator barrier. Subsequently, in step 450, a clock signal may be generated from the self-synchronized codes.

Step 420 of the method 400 may further comprise optional step 422 or step 424 shown in FIG. 4B and FIG. 4C. As shown in FIG. 4B, step 420 may comprise step 422 in which a header may be generated. The header, the first and second digital data streams may be subsequently arranged in at least partially inter-digitated manner into the combined data stream. Alternatively as shown in FIG. 4C, step 420 may comprise step 424 in which the combined data stream may be generated in accordance with a lookup table using partial bits of the first and second digital data streams.

Different aspects, embodiments or implementations may, but need not, yield one or more of the following advantages. For example, the use of use of self-synchronizing codes may be advantageous for eliminating the need of a high frequency receiver clock. This may contributes towards low power consumption of the isolation device. In addition, the bitstream encoding circuits shown in various embodiments may be advantageous as the method may be fault tolerance. Various features illustrated in the Specification may be desirable for improving communication accuracy and to prevent faulty communication.

Although specific embodiments of the invention have been described and illustrated herein above, the invention should not be limited to any specific forms or arrangements of parts so described and illustrated, but should also taking into consideration any combination of features illustrated in the same embodiment, or in other embodiments. The scope of the invention is to be defined by the claims appended hereto and their equivalents.

What is claimed is:

1. An isolation device, comprising:
   a first input terminal configured to receive a first digital data stream;
   a second input terminal configured to receive a second digital data stream;
   a bitstream encoding circuit configured to arrange the first and second digital data streams into a combined data stream;
   a transmitter configured to transform the combined data stream into a radiation data stream that is transmittable through an isolation barrier;
   a receiver separated from the transmitter by the isolation barrier and configured to receive the radiation data stream and, in response to receiving the radiation data stream, generate a received data stream; and
   a bitstream decoding circuit configured to decode the received data stream so as to generate a first received digital data stream and a second received digital data stream as a reproduction of the first and second digital data streams.

2. The isolation device of claim 1, further comprising a self-synchronizing code encoder configured to combine the combined data stream with a transmitting clock signal to form a single two-level self-synchronizing data stream.

3. The isolation device of claim 2, wherein the self-synchronizing code encoder comprises at least one of a Biphase Mark Code encoding circuit, a Manchester Code encoding circuit, a Line Code encoding circuit, a 2B1Q code encoding circuit, a Bipolar Code encoding circuit and an Alternative Mark inversion Code encoding circuit.

4. The isolation device of claim 2, further comprising a transmitting clock generator configured to generate the transmitting clock signal, wherein the transmitting clock generator is coupled to the self-synchronizing encoder.

5. The isolation device of claim 2, further comprising a self-synchronizing code decoder configured to decode the received data stream.

6. The isolation device of claim 5, wherein the self-synchronizing code decoder comprises a receiver clock generator configured to generate a receiving clock signal from the received data stream.

7. The isolation device of claim 1, wherein the bitstream encoding circuit comprises a buffer configured to store at least partial bits of the first and second digital data streams in a predetermined manner.

8. The isolation device of claim 7, wherein the buffer comprises at least a two-bit register configured to store one bit of the first digital data stream and one bit of the second digital data stream of concurrent timing.

9. The isolation device of claim 7, wherein the bitstream encoding circuit comprises an encoding lookup table configured to generate an output in accordance with the at least partial bits of the first and second digital data streams, wherein the output may be configured to be generated into the combined data stream.

10. The isolation device of claim 9, wherein the encoding lookup table comprises a plurality of word-data, wherein the plurality of word-data has a bit count at least twice as large as the buffer.

11. The isolation device of claim 10, wherein each of the plurality of word-data is unique and not reproducible by combining any two other of the plurality of word-data.

12. The isolation device of claim 1, wherein the bitstream decoding circuit comprises a shift register configured to receive the received data stream.

13. The isolation device of claim 12 further comprising a decoding lookup table, and a decoding circuit coupled to the shift register, wherein the decoding circuit is configured to generate the first received digital data stream and the second received digital data stream in accordance with the decoding lookup table.

14. The isolation device of claim 1, wherein the received data stream comprises a plurality of data packages, and wherein the isolation device further comprises a timing-check circuit configured to track a beginning of each of the plurality of data packages.

15. The isolation device of claim 14, further comprises a strobe generator configured to generate a signal indicative of a starting point of each of the plurality of data packages.

16. The isolation device of claim 1, further comprising a digital filter coupled to the bitstream decoding circuit.

17. The isolation device of claim 1, further comprising first and second sigma-delta analog-to-digital converters coupled to the first and second input terminals, respectively.

18. The isolation device of claim 1, wherein the bitstream encoding circuit operates at a clock rate at least four times faster than the first and second digital data streams.

19. An isolator, comprising:
a first analog-to-digital converter configured to generate a first digital data stream;
a second analog-to-digital converter configured to generate a second digital data stream;
a bitstream encoding circuit coupled to the first and second analog-to-digital converters so as to receive the first and second digital data streams, wherein the bitstream encoding circuit is configured to generate a combined data stream having the first and second digital data streams arranged in at least a partially interdigitated manner;
a transmitter configured to transform the combined data stream into a radiation data stream so as to transmit through an isolation barrier;
a receiver formed adjacent to but distanced from the transmitter configured to receive the radiation data stream and generate therein a received data stream; and
a bitstream decoding circuit configured to reproduce the first and second digital data streams.

20. The isolator of claim 19, wherein the first and second analog-to-digital converters are sigma delta type analog-to-digital converters.

21. The isolator of claim 19, wherein the bitstream encoding circuit comprises a buffer to temporarily store the first and second digital data streams, a header generator configured to generate a header, and a selector configured to arrange the header, the first and second digital data streams in the at least partially interdigitated manner as the combined data stream by dividing the header, the first and second digital data streams into a plurality of segments.

22. The isolator of claim 21, wherein the bitstream decoding circuit is configured to decode the header so as to identify the plurality of segments in a correct sequence.

23. The isolator of claim 21, wherein the bitstream decoding circuit comprises an error check circuit configured to check sequence of the plurality of segments.

24. The isolator of claim 21, wherein the header has a bit length, and wherein the bit length is larger than number of digital data streams coupled to the bitstream encoding circuit.

25. The isolator of claim 21, wherein the bitstream encoding circuit is coupled to an additional digital input and wherein the header is generated in accordance with the additional digital input.

26. A method for conveying a first signal and a second signal across an isolator barrier, comprising:
receiving the first signal and the second signal and in response, generating first and second digital data streams, respectively;
arranging the first and second digital data streams into a combined data stream;
encoding the combined data stream into self-synchronized codes;
transmitting the self-synchronized codes across the isolator barrier; and
generating a clock signal from the self synchronized codes.

27. The method of claim 26, wherein the arranging the first and second digital data streams into the combined data stream comprises generating a header and arranging the header, the first and second digital data streams in at least partially interdigitated manner into the combined data stream.

28. The method of claim 26, wherein the arranging the first and second digital data streams into the combined data stream comprises generating the combined data stream in accordance with a lookup table using partial bits of the first and second digital data streams.

* * * * *